United States Patent [19]

Lin

[11] Patent Number: 5,287,299
[45] Date of Patent: Feb. 15, 1994

[54] METHOD AND APPARATUS FOR IMPLEMENTING A DIGITAL FILTER EMPLOYING COEFFICIENTS EXPRESSED AS SUMS OF 2 TO AN INTEGER POWER

[75] Inventor: Kun Lin, Tucson, Ariz.

[73] Assignee: Monolith Technologies Corporation, Tucson, Ariz.

[21] Appl. No.: 889,134

[22] Filed: May 26, 1992

[51] Int. Cl.[5] .............................................. G06F 7/52
[52] U.S. Cl. ................................. 364/759; 364/736; 364/724.01; 364/750.5
[58] Field of Search .................. 364/724.01, 724.16, 364/724.17, 754, 757, 759, 736, 750.5

[56] References Cited

U.S. PATENT DOCUMENTS

| | | | |
|---|---|---|---|
| 4,356,558 | 10/1982 | Owen et al. | 364/724 |
| 4,679,164 | 7/1987 | Rearick | 364/728.01 |
| 4,709,343 | 11/1987 | Van Cang | 364/724.01 |
| 4,782,458 | 11/1988 | Bhattacharya et al. | 364/724.16 |
| 4,862,402 | 8/1989 | Shah et al. | 364/724.12 |
| 4,974,186 | 11/1990 | Duhamel et al. | 364/750.5 |

*Primary Examiner*—Tan V. Mai
*Attorney, Agent, or Firm*—Streich Lang

[57] ABSTRACT

Method and apparatus for implementing a digital filter employing coefficients expressed as sums of 2 to an integer power. Coefficients expressed as sums of powers of 2 may be algebraically manipulated such that higher order terms are replaced by an equivalent group of lower order terms. In the context of a shift-and-add algorithm, the lower order terms require fewer shifting operations and less total hardware to effect multiplication than the corresponding higher order terms.

20 Claims, 4 Drawing Sheets

METHOD AND APPARATUS FOR IMPLEMENTING A DIGITAL FILTER EMPLOYING COEFFICIENTS EXPRESSED AS SUMS OF 2 TO AN INTEGER POWER

TECHNICAL FIELD

The present invention relates, generally, to multiplierless finite impulse response (FIR) and infinite impulse response (IIR) filters having coefficients which may be expressed as sums of two (2) to an integer power, and more particularly to methods and apparatus for implementing powers-of-two coefficients in a manner which simplifies hardware complexity and reduces the number of shift operations required to effect multiplication.

BACKGROUND OF THE INVENTION

Digital filters, particularly FIR and IIR filters, are increasingly used in digital signal processing and real time digital and audio processing. As a result of the extensive use of these filters, powerful and mature optimization theories are available to aid in filter design. Conventional hardware realization of such filters utilizes the basic functional components of delay units, multipliers, and adders. Of these basic functional components, the hardware implementation of multipliers is typically the most complex and computationally expensive. In addition, multipliers occupy a significant portion of the available "real estate" on a given chip. Furthermore, substantial propagation delay is introduced by multipliers, thereby limiting processing speed.

In order to increase processing speed and simultaneously reduce component cost and complexity, contemporary filter design techniques often employ "multiplierless" technology, wherein the multipliers are replaced with binary adders and shift registers, and a "shift-and-add" scheme is employed in lieu of conventional multiplication techniques.

The use of multiplierless filtering requires that the coefficients by which the input data is multiplied comprise a sum of terms, each of the form $2^p$. This results from the fact that a binary multiplication by a "power-of-two" coefficient is equivalent to a shift of the multiplicand; complex multiplication may thus be effected through a series of simple shifting and adding operations.

Presently known multiplierless digital filters, however, are unsatisfactory in several respects. For example, coefficients expressed in terms of powers-of-two often contain terms of very high order, for example $2^{-28}$ and higher. In order to shift an n-bit input data term twenty-eight times, conventional shift registers must be of a length sufficient to accommodate at least n+28 bits. For an 18 bit input data value, this requires shift registers in excess of 46 bits in length, although a shorter length may suffice if truncation is permitted. Hardware implementation of these registers can be quite cumbersome, often introducing substantial propagation delay relative to lower order coefficient powers. In addition, the aggregate number of shifts for a coefficient having a plurality of higher order terms further decreases processing speed. See, for example, Bhattacharya et al. U.S. Pat. No. 4,782,458 issued Nov. 1, 1988; Owen et al. U.S. Pat. No. 4,356,588 issued Oct. 22, 1982; and Shah et al. U.S. Pat. No. 4,862,402 issued Aug. 29, 1989.

A multiplierless digital filter is needed which exploits the shift-and-add algorithm using sums of powers-of-two coefficients in a manner which optimizes the complexity of the shifter registers and the number of shifts required to "multiply" coefficients having high order exponential terms.

SUMMARY OF THE INVENTION

The present invention provides methods and apparatus for efficiently implementing the shift-and-add function in the context of powers-of-two coefficients. In accordance with one aspect of the invention, the shift-and-add method of "multiplying" an input data term by a coefficient is implemented in a shifter comprising an optimum bit length. A notable advantage of the implementation scheme of the present invention is a dramatically reduced number of shift operations required to perform the shift-and-add function.

In accordance with a further aspect of the invention, each coefficient may be algebraically manipulated to reduce higher order exponential terms to an equivalent, nested group of lower order terms.

In accordance with a preferred embodiment of the present invention, the foregoing algebraic manipulation is accomplished by factoring lower order exponential terms from higher order exponential terms in the coefficient expression, effectively nesting the lower order terms. The nested lower order terms are mathematically and computationally equivalent to the previously factored higher order terms, yet at the same time reduce the aggregate number and length of shifts required to effect computation.

BRIEF DESCRIPTION OF THE DRAWINGS

Preferred exemplary embodiments of the present invention will hereinafter be described in conjunction with the appended drawing figures, wherein like numerals denote like elements and.

DETAILED DESCRIPTION

Figure 1:
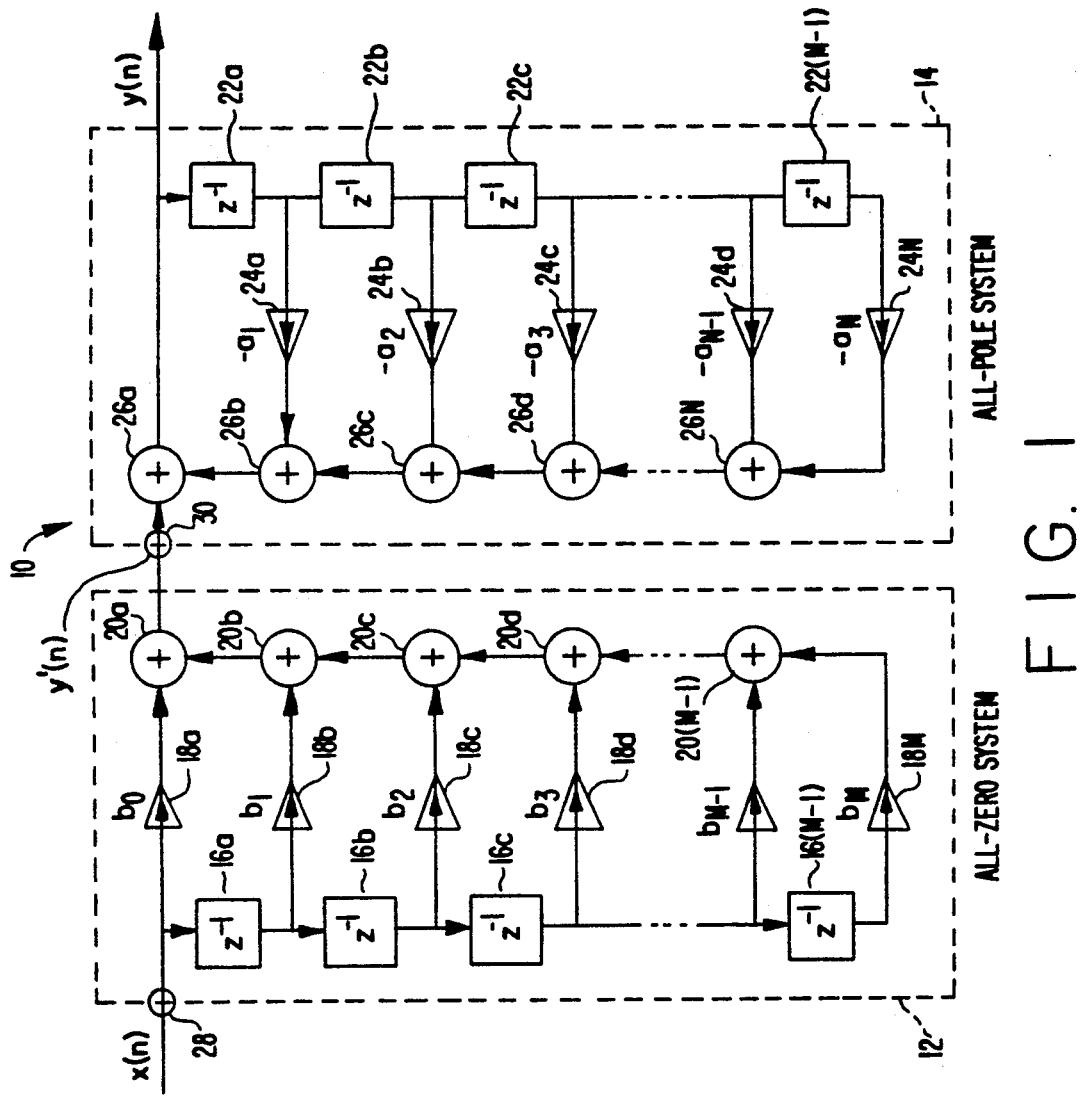
FIG. 1 is a schematic circuit diagram of an exemplary prior art digital filter.

Referring to FIG. 1, the classical hardware realization of a prior art digital filter 10 typically includes a first circuit 12 and a second circuit 14 First circuit 12 comprises respective delay units 16(a), 16(b), 16(c) . . . 16(M−1); respective multipliers 18(a), 18(b), 18(c). . . . 18(M); and respective summing junctions 20(a), 20(b), 20(c) . . . 20(M−1). Similarly, second circuit 14 comprises respective delay units 22(a), 22(b), 22(c) . . . 22(N−1); respective multipliers 24(a), 24(b), 24(c) . . . 24(N); and respective summing junctions 26(a), 26(b) . . . 26(N).

The general input/output expression for a digital filter may thus be expressed in the following manner:

$$y(n) = (a_1(y_{n-1}) + a_2(y_{n-2}) + a_3(y_{n-3}) \cdots + a_N(y_{n-N})) + (b_0(x_n) + b_1(x_{n-1}) + b_2(x_{n-2}) \cdots + b_M(x_{n-M})) \quad (1)$$

where y(n) represents the output data, $x_n$ represents the input (sampled) data, $y_n$ represents previously computed output data, and $a_i$, $b_i$ represent coefficients by which the $x_n$ and $y_n$ values, respectively, are multiplied (weighted).

A finite impulse response (FIR) filter is characterized by $a_i=0$ for i=1 to N. The output y(n) for an FIR filter is thus a function of the input data $x_i$ and the $b_i$ coefficients only. Conversely, an infinite impulse response (IIR) filter employs feedback in the form of previous output data and is characterized by $a_i \neq 0$ for one or more of i=1 to N.

During each cycle of operation of filter 10, sampled input data x(n) enters first circuit 12 at an input junction 28 and is loaded into multiplier 18(a) and delay unit 16(a). Multiplier 18(a) multiplies data point x(n) by coefficient $b_0$, which is either resident in multiplier 18(a) or retrieved from a coefficient ROM (not shown), and the product "$b_0 x(n)$" is applied to summing junction 20(a). During each successive cycle of operation, a subsequent input data word x(n) is loaded into multiplier 18(a) and delay unit 16(a), and the data x(n−1) from the previous cycle is loaded from delay unit 16(a) into delay unit 16(b) and simultaneously applied to multiplier 18(b). During each operational cycle, the input data point then currently resident in each multiplier 18(a)-18(M) is multiplied by the corresponding coefficient $b_0$-$b_M$ associated with the respective multiplier. The products of the foregoing multiplications are sequentially summed in respective summing units 20(a) to 20(M−1), so that the following summation value y'(n) is output from summing unit 20(a) for each cycle:

$$y'(n) = \sum_{i=0}^{N} b_i x_i \tag{2}$$

The term y'(n) thus represents a weighted average value of M previous values of the input data x(n).

The term y'(n) is then applied to second circuit 14 at an input junction 30. If all of the coefficients $-a_1$ to $-a_N$ are zero, indicating that the filter is an FIR filter, y'(n) passes through second circuit 14 and is output therefrom as output y(n). If, on the other hand, one or more of coefficients $-a_1$ to $-a_N$ are non-zero, indicating that filter 10 is an IIR filter, y'(n) is further processed in second circuit 14 before emerging as output y(n). (As a practical matter, second circuit 14 may simply be omitted in a dedicated FIR filter).

More particularly, second circuit 14 functions analogously to first circuit 12; "input" data y'(n) is sequentially summed at summing unit 26(a) with N previous weighted values of y(n). In this context, the "weighting" is effected by respective coefficients $-a_1$ to $-a_N$ associated with multipliers 24(a) to 24(N), respectively.

The techniques employed in the present invention are equally applicable in both IIR and FIR filters. However, to simplify the discussion and reduce computational complexity, a preferred embodiment is described herein with reference to a FIR filter.

For $a_i=0$ for i=1 to N in Equation (1), the general expression for a finite impulse response (FIR) filter is given as:

$$y(n) = b_0 x_n + b_1 x_{n-1} + b_2 x_{n-2} \ldots + b_M x_{n-M} \tag{3}$$

where "x" is the sampled input data word and each "b" represents a unique coefficient by which each "x" is sequentially "weighted".

As discussed above, it is often desirable to perform the task of multiplying the value of the coefficient "b" by the value of the input data "x" without the use of a conventional hardware multiplier. This is accomplished in the context of the present invention through the use of a shifter and adder configured to execute a "shift-and-add" algorithm.

Use of the shift-and-add technique requires each coefficient to be expressed as a sum of powers-of-two as follows:

$$b_i = f_1 2^{-p_1} + f_2 2^{-p_2} + f_3 2^{-p_3} \ldots + f_L 2^{-p_L} \tag{4}$$

where f = −1, 0, or +1 and each exponent "p" is an integer.

For a hypothetical coefficient "b" having a single power of two term, the binary word representing the data input "x" is shifted "p" times, where "p" is the integer value of the exponent of the term comprising the coefficient. Upon being shifted "p" times, the resulting shifted value of "x" is equivalent to the product of "x" and "b." For a coefficient "b" comprising a sum of L powers-of-two, the binary input word "x" undergoes the foregoing shifting operation L times, where L equals the number of terms comprising the coefficient expression. The respective resulting shifted values are then summed to form the product of "x" and "b."

Digital filters which implement the foregoing shift-and-add scheme utilizing a binary adder and shift register in lieu of a conventional multiplier are known as "multiplierless" filters. Multiplierless filters employ coefficients of the form set forth in Equation (4). In accordance with one aspect of the present invention, Equation (4) may be simplified for a particular coefficient "b" by eliminating all terms for which f=0; Equation (4) thus becomes the expression for a unique coefficient $b_i$ comprising a sum of L terms, wherein each term is of the form $f 2^{-p}$ where "p" is an integer and f=−1 or +1.

In accordance with the nesting technique of the present invention, Equation (4) is algebraically manipulated based on the following relationship:

$$(2^x)(2^y) = 2^{(x+y)} \tag{5}$$

The integer exponents may thus be re-coded as the differences of the powers-of-two in accordance with the following formula:

$$\begin{aligned}
-p1 &= -p1 \\
-p2 &= -[p1 + q1] \\
-p3 &= -[p2 + q2] \\
    &= -[p1 + q1 + q2] \\
    &\ldots \\
-pL &= -[p(L-1) + q(L-1)] \\
    &= -[p1 + q1 + q2 + \ldots q(L-1)]
\end{aligned}$$

Equation (4) may thus be rewritten as:

$$b_i = f_1 2^{-p1} + f_2 2^{-(p1+q1)} + f_3 2^{-(p1+q1+q2)} + \ldots f_L 2^{-(p1+q1+q2\ldots+q(L-1))} \tag{6}$$

-continued
$$= f_1 2^{-p_1}\{1 + g_2 2^{-q_1}[1 + g_3 2^{-q_2}(\ldots <1 + g_L 2^{q(L-1)}> \ldots)]\}$$

where $g_i + 1$ or $-1$ for $i = 2$ to $L$.

The following Table illustrates various exemplary values of powers-of-two for certain integer values of "p":

TABLE 1

| p | $2^{-p}$ | Fractional Value | Decimal Value |
|---|---|---|---|
| 0 | $2^0$ | 1/1 | 1. |
| 1 | $2^{-1}$ | ½ | .5 |
| 2 | $2^{-2}$ | ¼ | .25 |
| 3 | $2^{-3}$ | ⅛ | .125 |
| 4 | $2^{-4}$ | 1/16 | .0625 |
| 7 | $2^{-7}$ | 1/128 | .0078125 |
| 14 | $2^{-14}$ | 1/16384 | .000061 |
| 19 | $2^{-19}$ | 1/524288 | .0000019 |
| 28 | $2^{-28}$ | 1/268000000 | .00000000372 |

To illustrate the nesting technique of the present invention, consider an exemplary coefficient $b = 0.0078716$. When expressing a particular coefficient in terms of a sum of powers-of-two, it is necessary to select a combination of values from Table 1, adding and subtracting the various terms (and perhaps multiples thereof) as necessary to arrive at an appropriate sum of powers-of-two expression for the coefficient. Thus, any arbitrary coefficient, for example the coefficient $b = 0.0078716$, may be expressed as:

$$b = .0078716 \quad (7)$$
$$= .0078125 + .000061 - .0000019$$
$$b = 2^{-7} + 2^{-14} - 2^{-19}$$

Multiplying a data input value "x" by the coefficient "b" (as expressed in Equation (7)) in the context of prior art techniques would involve sequentially shifting and adding the data input value "x" by each of the three terms in Equation (7) utilizing conventional shift registers. More particularly, the shift and add operation would entail: (a) shifting "x" seven times; (b) shifting "x" fourteen times; (c) shifting "x" nineteen times and taking the two's complement of the result (to facilitate subtraction of $2^{-19}$); and (d) summing the results of the three shifting operations to arrive at the value of "b" times "x." If "x" is a j-bit data word, this would require a register of at least $19 + j$ flip-flops in length, and would require a total of $19 + 14 + 7 = 40$ shift operations, although a smaller register may be used if least significant bits are truncated.

In accordance with the nesting technique of the present invention, the sum of powers-of-two formulation of coefficient "b" (Equation (7)) may be manipulated in accordance with the relationship set forth in Equation (6) to yield the following exemplary expression:

$$b = 2^{-7} + 2^{-14} - 2^{-19} \quad (8)$$
$$= 2^{-7}(1 + 2^{-7} - 2^{-12})$$
$$= 2^{-7}[1 + 2^{-7}(1 - 2^{-5})]$$

If "x" is again a j-bit data word, a register of only $7 + j$ flip/flops in length and a total of only $7 + 7 + 5 = 19$ shifting operations would be required to produce the product of "b" and "x". This is substantially less than that required to "multiply" the same coefficient expressed in the form of Equation (7).

Figure 2:
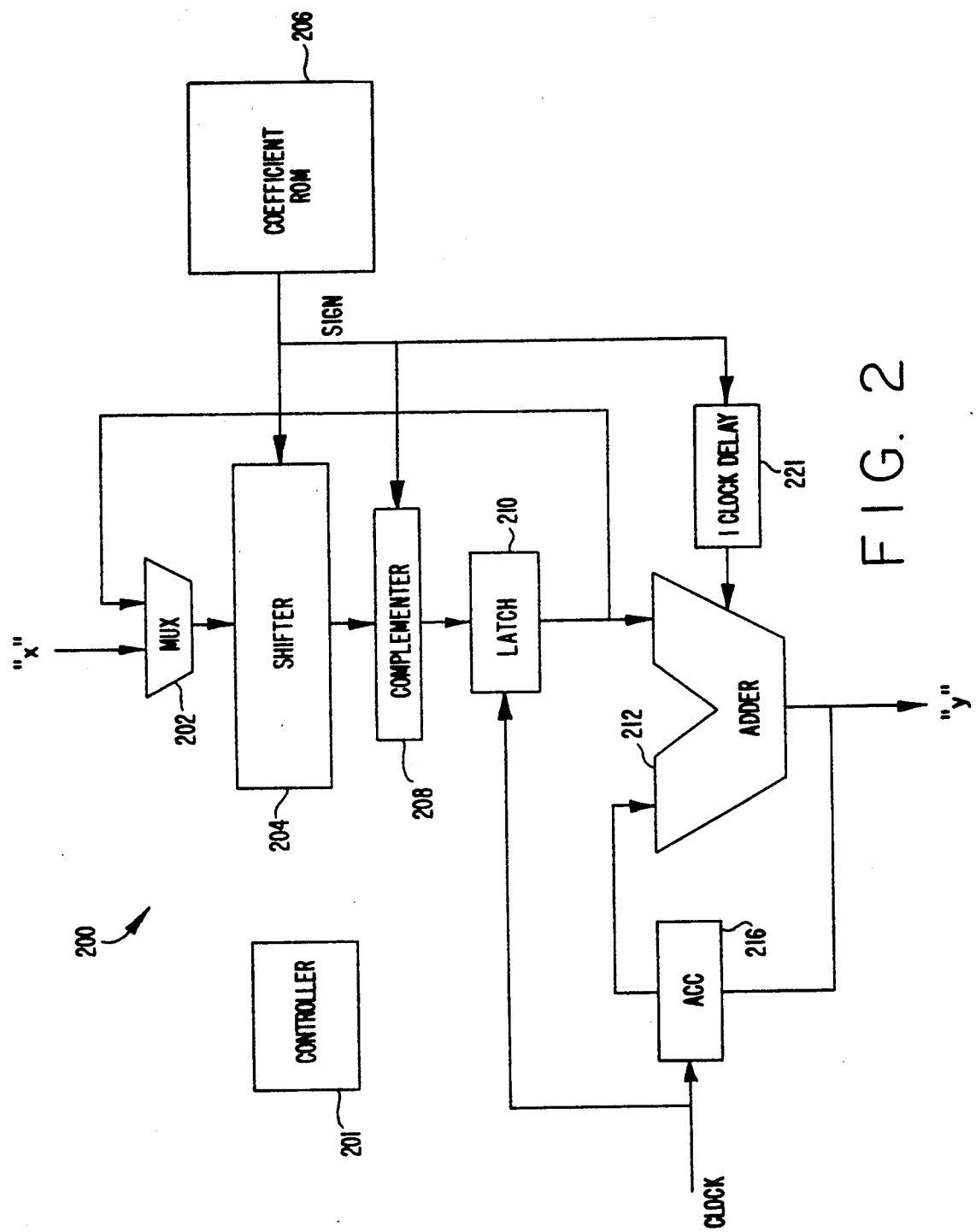
FIG. 2 is a schematic block diagram of a preferred exemplary embodiment of a circuit for implementing a shift-and-add algorithm in accordance with the present invention.
Figure 3:
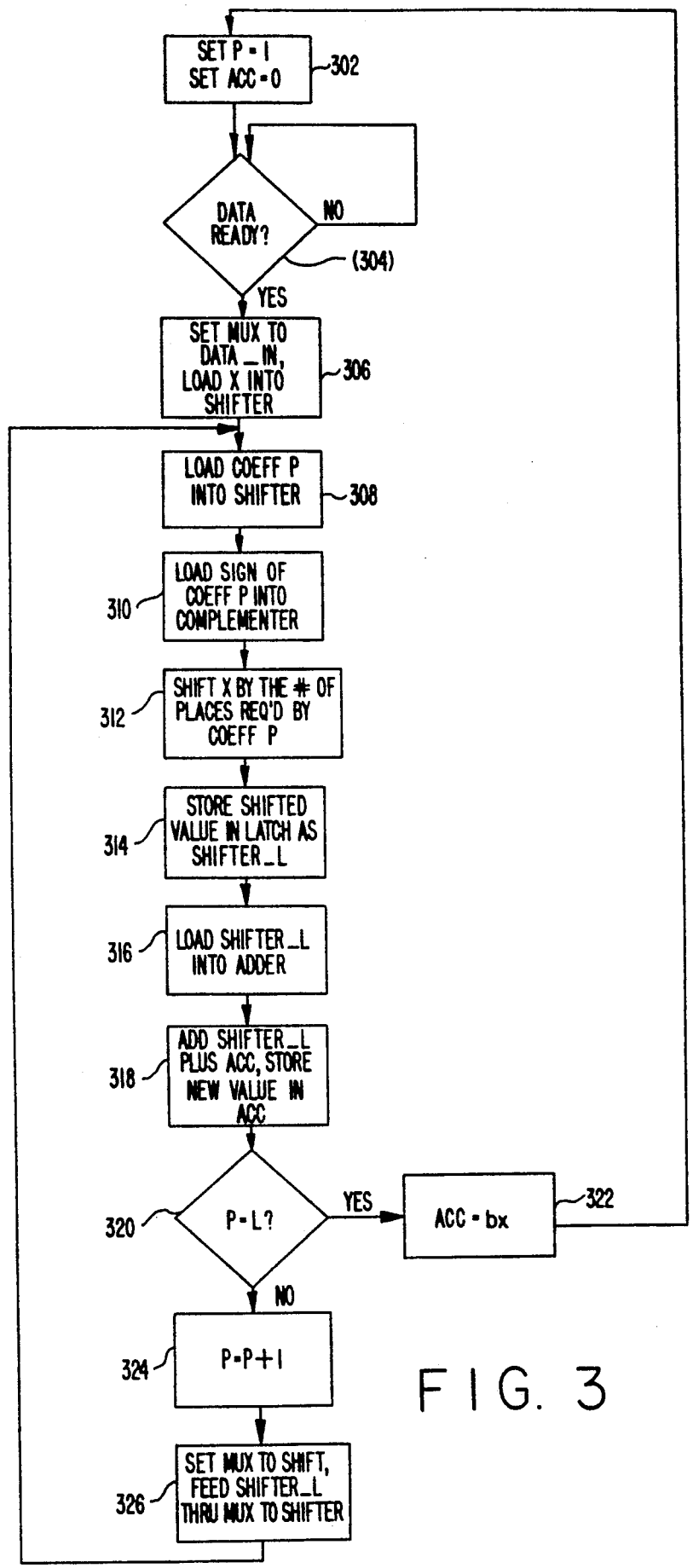
FIG. 3 is a flow chart which describes the operation of the circuit of FIG. 2.

A preferred embodiment of the apparatus and method for implementing the shift-and-add algorithm in conjunction with the foregoing nesting scheme is set forth in FIGS. 2 and 3. More particularly, an exemplary "multiplierless multiplier" circuit 200 suitably comprises a controller 201, a multiplexer (MUX) 202, a shifter 204, a coefficient ROM 206, a complementer 208, a latch 210, an adder 212, a delay unit 221, a feedback link 207, and an accumulator 216.

Controller 201 cooperates with and controls the various components comprising circuit 200 in a predetermined manner in accordance with instructions resident in the controller. Controller 201 may comprise a conventional microprocessor suitably adapted to effect the desired operation of circuit 200. More particularly, a set of instructions ("program") are preferably resident in controller 201, which instructions are sequentially executed, thereby controlling the interrelationship of the various functional components comprising circuit 200. In this regard, controller 201 preferably cooperates with the various components of circuit 200 through appropriate electrically conductive paths which are not shown in FIG. 2 to enhance clarity.

Shifter 204 may comprise any suitable mechanism for effecting the shifting of an input data word. For example, shifter 204 may comprise a shift register configured to shift an input data word one place during each clock cycle of operation of circuit 200. Alternatively, shifter 204 may comprise a barrel shifter configured to shift an input data word a predetermined number of places during a single clock pulse. A more detailed discussion of shifter 204 is set forth below in connection with FIG. 4.

With continued reference to FIGS. 2 and 3, prior to the beginning of each shift-and-add cycle, the value in accumulator 216 is set to zero (ACC=0) and the value of a coefficient pointer "p" is set to 1 (FIG. 3, step 302). When a data word "x" is applied to circuit 200 (step 304), MUX 202 is set to the DATA-IN mode to load "x" into shifter 204 (step 306). Any suitable scheme may be utilized to load binary words (i.e., input data and coefficients) into shifter 204. For example, those skilled in the art will appreciate that data may be sequentially clocked into the shifter on a bit-by-bit basis; alternatively, data may be loaded into shifter 204 in a single clock pulse through a parallel input interface.

The first coefficient term is then loaded from coefficient ROM 206 into shifter 204 (step 308). The sign of the coefficient, corresponding to the value of $f_i$ in Equations (4) and (6), is also loaded from coefficient ROM 206 into complementer 208 (step 310). The sign of the coefficient determines whether the corresponding term, upon being "multiplied" by the data word "x," will be added to or subtracted from the then current value in accumulator 216, as discussed below.

The value of "x" is then shifted the appropriate number of places, as controlled by the integer value of the exponent of the $p^{th}$ coefficient term (step 312). The value of the shifted data word is then stored in latch 210 as SHIFTER_L (step 314). The values of ACC and SHIFTER_L are then loaded into adder 212 (step 316). Adder 212 adds the value of SHIFTER L to the current value of ACC and stores the sum in accumulator 216 (step 318).

A determination is then made whether all "L" terms comprising coefficient "b" have been considered (step 320). Any suitable mechanism may be employed to determine whether all L terms have been considered. For example, a counter, a comparator, math unit, or similar component may be utilized to keep track of the number of terms associated with a particular coefficient which have been considered. Alternatively, the instruction program resident in controller 201 may be configured to specifically account for each term comprising each coefficient stored in ROM 206, thereby eliminating the need for coefficient pointer "p". This letter scheme is particularly appropriate when the invention is embodied in an integrated circuit. Assuming all terms of a particular coefficient have not been accounted for, the next succeeding coefficient term is retrieved, for example by incrementing the value of "p" by one (step 324).

MUX 202 is then set to the SHIFT mode so that the value of SHIFTER_L (stored in latch 210) may be loaded into shifter 204 (step 326). The second coefficient term (corresponding to P=2) is then loaded from coefficient ROM 206 into shifter 204 (step 308), and the previously shifted and stored "x" value ("SHIFTER_L") is again shifted in accordance with the integer value of the power of two comprising the second coefficient term (step 312). The result is stored in latch 210, i.e., the former contents of SHIFTER_L are deleted and replaced with the new value. The contents of SHIFTER_L are then loaded into adder 212, as are the contents of accumulator 216. Adder 212 computes the sum of these two values and again stores the new summation value as ACC in accumulator 216.

In accordance with another aspect of the invention, a sign bit advantageously precedes the binary value of a coefficient term in coefficient ROM 206. In this way, the product of the coefficient term and the contents of shifter 204 may be appropriately added or subtracted from the value of ACC during the summation carried on by adder 212. Specifically, if a particular term in the coefficient expression is preceded by a "plus" sign, indicating that that term's contribution is to be added to the current value of ACC, a sign bit of "1" precedes the binary word, and the function of complementer 208 is effectively bypassed. If, on the other hand, a particular term is preceded by a "minus" sign, indicating that that term's contribution is to be subtracted from ACC, the complement of the term is computed by complementer 208, and the sign bit is added to the complemented term via delay unit 221. Those skilled in the art will appreciate that the addition of the "two's complement" of a term is equivalent to subtraction of that term.

The above process is repeated until all L terms of the coefficient expression are accounted for. When all terms comprising the coefficient expression have been accounted for, i.e., the number ("L") of completed shifting operations equals the number of terms in the coefficient expression (step 320), the shift-and-add operation is complete and the value resident in accumulator 216 (ACC) is equivalent to the multiplication of the "x" input data value times coefficient "b" (step 322). The value of coefficient counter "p" is then reset to 1, the value ACC in accumulator 216 is reset to zero, the next data input value "x" is retrieved and the process set forth in FIG. 3 is repeated.

Equation (7) sets forth a coefficient "b" expressed as a sum of L terms, where L=3. Thus, in the example of Equations (7) and (8), the foregoing process involves successively shifting the original data input word "x" a predetermined number of times, and summing the respective shifted values to produce the product of "x" and "b." More specifically, in the initial cycle, the binary word 111, representing the first coefficient term $2^{-7}$, is applied to shifter 204, and the value of "x" is shifted to the left by 7 places. (Those skilled in the art will appreciate that an appropriate interface device, for example a counter, may be disposed between coefficient ROM 206 and shifter 204 in an embodiment wherein shifter 204 comprises a conventional shift register.) The shifted word is then latched into latch 210 and applied to adder 212 to be summed with the then current value of ACC; the contents of latch 210 are also reloaded into shifter 204, for example via MUX 202 and feedback link 207, and are again shifted in accordance with the value of the second term of coefficient "b".

More particularly, the previously shifted data word currently resident in shifter 204 is then shifted another 7 places (corresponding to the second term in Equation (7), namely $2^{-7}$), latched into latch 210, and thereafter added to the then current value of ACC. The contents of latch 210 are then "recycled" into shifter 204. The final coefficient term ($2^{-5}$; see Equation (8)) is retrieved from coefficient ROM 206 and loaded into shifter 204, and the current value in shifter 204 is shifted an additional five times. The resulting value is complemented in complementer 208, loaded into adder 212, and added to the current value of ACC to produce the net result of "x" times "b" (note that the third term in the example (Equations (7) and (8)) is preceded by a "minus" sign).

In accordance with a further aspect of the invention, coefficient ROM 206 may be configured to store any desired number of coefficients, each having any desired number of terms. For example, if multiplier circuit 200 is employed to function as an "n" tap filter, then "n" coefficients, each having a plurality of terms, would be stored in coefficient ROM 206. Those skilled in the art will appreciate, however, that a symmetrical "n" tap filter will require n/2 coefficients.

As discussed above, shifter 204 suitably comprises any conventional shifter capable of shifting an input data word a desired number of places. For example, shifter 204 may comprise a conventional shift register having a fixed number of flip-flops disposed to sequentially shift an input data word in a shift-left or shift-right mode in accordance with a coefficient term received from coefficient ROM 206. In accordance with one aspect of the invention, the length (i.e., number of bits) of the shift register comprising shifter 204 is a function of, inter alia, a predetermined desired level of precision in the shifted data word; that is, shifter 204 need not be of a length sufficient to accommodate shifting and n-bit data word a total of, for example, j places (i.e., a total register bit length of n+j bits). Rather, the shifter need only be of a bit length sufficient to accommodate shifting the input data word the required number of places while retaining an acceptable number of most significant bits. In this way, the number of bits by which a shifted data word exceeds the bit length of the shifter are truncated. Those skilled in the art will appreciate that the truncation of a predetermined number of least significant bits yields an acceptable level of precision in the shifted data word.

The manner in which shifter 204 shifts an input data word in accordance with an alternate embodiment of the invention will now be described.

Figure 4:
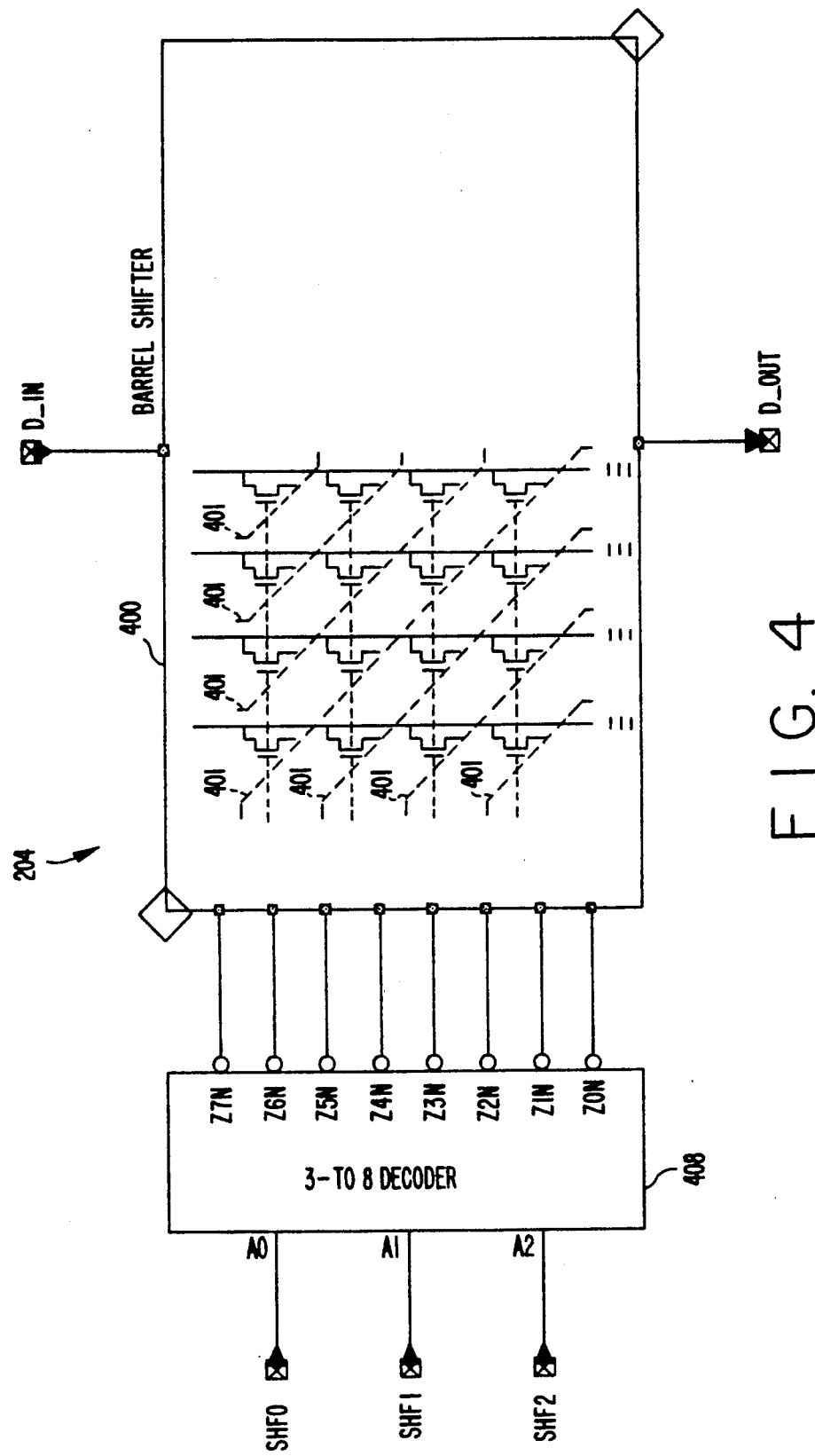
FIG. 4 is a schematic representation of an exemplary shifter in accordance with a preferred embodiment of the present invention.

Referring now to FIG. 4, an alternate preferred embodiment of shifter 204 preferably comprises a barrel shifter 400 coupled to a decoder 408. In the illustrated embodiment, decoder 408 comprises an n to $2^n$ decoder, where n is equal to the number of bits required to express the absolute value of the largest exponent of any term in coefficient ROM 206. For example, if n=3, the largest value of a coefficient term would be $2^{-7}$ (the number 7 being expressed as 111 in binary notation).

Decoder 408 further comprises respective input lines SHF0, SHF1, SHF2, and respective output lines Z0N-Z07. Barrel shifter 400 preferably comprises a parallel data input interface D_IN, a parallel data output interface D_OUT, $2^n$ rows of transistors electrically connected to respective output lines Z0N-Z07, respectively, and a plurality of diagonal conductors 401 connecting each transistor to a unique location in output interface D_OUT.

For a particular coefficient term retrieved from coefficient ROM 206 and loaded into shifter 204, the binary representation of that coefficient's exponent is applied to respective input lines SHF0, SHF1, and SHF2. Depending on the binary value of the exponent of the particular coefficient term, one of respective output lines Z0N-Z7N is turned on.

More particularly, decoder 408 activates a unique one of output lines Z0N-Z07 corresponding to the binary number applied at the input lines. For example, if the binary number 111 (equal to 7), corresponding to the coefficient term $2^{-7}$, is applied to input lines SHF0-SHF2, output line Z7N goes high while output lines Z0N-Z6N remain low. The data word applied to barrel shifter 400 at data interface D_IN is thus loaded into the first transistor row (corresponding to output line Z7N). At the next clock pulse, the data word is applied to output interface D_OUT along respective diagonal conductors 401, effectively shifting the data word seven places, with the resulting shifted value appearing at data output interface D_OUT. Similarly, if the binary word 010 (equal to 2), corresponding to the coefficient term $2^{-2}$, is applied to input lines SHF0-SHF2 of decoder 408, output line Z2N assumes a high logic state while the remaining output lines remain low. The data input word applied to barrel shifter 400 will thus be shifted two places, with the resulting shifted data word appearing at D_OUT.

In accordance with a further aspect of the invention, the reduction (nesting) of certain coefficient expressions may be further enhanced through the insertion of "dummy" powers of two. For example, consider the coefficient:

$$b = 2^{-7} - 2^{-21} + 2^{-28}.$$

If the above-described nesting scheme is used directly, the foregoing equation can be reduced to the following:

$$b = 2^{-7}[1 - 2^{-14}(1 - 2^{-7})].$$

While this nesting operation reduces shifter area by approximately 50% and reduces coefficient ROM by approximately 15%, further reduction may be achieved by inserting dummy powers of two as follows:

$$b = 2^{-7} + 2^{-14} - 2^{-14} - 2^{-21} + 2^{-28}$$
$$= 2^{-7}\{1 + 2^{-7}[1 - 1 - 2^{-7}(1 + 2^{-7})]\}$$

Thus, the maximum number of shifts required to be performed in any shifting operation is reduced from fourteen to seven. The foregoing reduction scheme is particularly well suited to sums of powers of two having exponents which are integer multiples of a lower order term.

While the subject invention has been described in conjunction with the preferred embodiment, those skilled in the art will appreciate that various modifications may be made to the disclosed algorithm and to the selection and arrangement of the components for executing the scheme described herein. For example, coefficient ROM 206, shifter 204, and complementer 208 may be replaced with an equivalent series of summing modules, each comprising a hard wired binary word corresponding to the coefficient terms stored within coefficient ROM 206. In addition, a plurality of shifters may be employed in lieu of shifter 204 to effect simultaneous computation of various terms comprising a particular coefficient. These and other modifications to the hardware and software described herein may be made without departing from the spirit of the invention as expressed in the appended claims.

I claim:

1. An apparatus for generating indicia of the product of a data word x and a binary coefficient b, the coefficient b being expressible as a sum of L terms each of the form $f2^{-p}$, where $f = +1, -1$, or o and p is a positive integer, said apparatus comprising:

a coefficient memory configured to store indicia of said coefficient b;

a shifter comprising shifter input means for loading data into said shifter, said shifter being coupled to said coefficient memory to selectively shift the contents of said shifter in accordance with one of said terms;

a feedback link disposed to apply data output from said shifter to said shifter input means; and summing means configured to receive data output from said shifter, for successively summing L data values output from said shifter to thereby generate said indicia of said product of said data word x and said coefficient b.

2. The apparatus of claim 1, wherein said summing means comprises an adder having respective first and second adder input means for loading data into said adder, said first adder input means being operatively coupled to said shifter; and an accumulator cooperating with said adder to selectively receive an output from said adder and to apply the contents of said accumulator to said second adder input means.

3. The apparatus of claim 2, further comprising latch means, coupled to said first adder input means, for latching said data output from said shifter and applying the latched data to said adder.

4. The apparatus of claim 1, wherein:

said coefficient b is expressible in the form $b = f_1 2^{-p(1)} + f_2 2^{-p(2)} \ldots f_L 2^{-p(L)}$; and said indicia of said coefficient b comprise respective integer values $p(1), f(1) \ldots q(L-1)$, wherein $p(1) = p(1)$ $p(2) = p(1) + f(1)$ $p(L) = p(1) + q(1) \ldots + f(L-1).$ 5. The apparatus of claim 1, further comprising complementer means coupled to said shifter for selectively complementing said data output from said shifter in accordance with a sign value stored within said coefficient memory.

6. The apparatus of claim 5, further comprising:
   latch means for applying said data output from said shifter to said summing means;
   multiplexer means for selectively applying one of said data word x and said data output from said shifter on said feedback link to said shifter input means; and
   controller means for controlling the operation of said coefficient memory, said shifter, and said summing means.

7. The apparatus of claim 1, further comprising multiplexer means for selectively applying said data word x to said shifter input means.

8. The apparatus of claim 1, further comprising multiplexer means for selectively applying said data output from said shifter to said shifter input means.

9. The apparatus of claim 1, further comprising processing means for processing said data output from said shifter and applying the processed data to said feedback link.

10. The apparatus of claim 2, further comprising controller means for controlling the operation of said coefficient memory, said shifter, and said summing means.

11. A method of effecting the shift-and-add operation of a binary data word x in accordance with a binary coefficient b expressible as a sum of terms each of the form $f2^{-p}$, where $f = +1$, or o and p is an integer, the method comprising the steps of:
   loading said data word x into a shifter;
   shifting said data word x in accordance with a first one of said terms comprising said coefficient b to produce a first shifted value;
   feeding said first shifted value back into said shifter;
   shifting said first shifted value in accordance with a second one of said terms comprising said coefficient b;
   summing a plurality of values output from said shifter to thereby generate indicia of the product of data word x and coefficient b.

12. The method of claim 11, wherein said step of shifting said first shifted value in accordance with a second one of said terms comprises generating a second shifted value, the method further comprising the steps of:
   loading sand second shifted value into said shifter;
   shifting said second shifted value in accordance with a third one of said terms to generate a third shifted value; and
   wherein said summing step comprises:
   adding said first shifted value to said second shifted value in an adder to generate a first sum and storing said first sum in an accumulator;
   retrieving said first sum from said accumulator and applying said first sum and said third shifted value to said adder; and
   adding said first sum and said third shifted value.

13. The method of claim 11, wherein:
   said coefficient b is expressible as a sum of L terms of the form $f2^{-p}$;
   the contents of said shifter are replaced and shifted L times in accordance with a respective one of said terms;
   the output of said shifter is loaded into said shifter $(L-1)$ times; and said summing step comprises summing L values output from said shifter.

14. The method of claim 11, wherein:
   said coefficient b is expressible in the form $b = f_1 2^{-p(1)} + f_2 2^{-p(2)} \ldots f_L 2^{-p(L)}$; and
   said indicia of said coefficient by comprises respective integer values $p(1), f(1) \ldots q(L-1)$, wherein $p(1) = p(1)$ $p(2) = p(1) + f(1)$ $p(L) = p(1) + q(1) \ldots + f(L-1);$ said step of shifting said data word x comprises shifting said data word x in accordance with $p(1)$; and
   said step of shifting said first shifted value comprises shifting said first shifted value in accordance with $q(1)$.

15. The method of claim 11, wherein said feeding step comprises processing said data output from said shifter and thereafter applying said processed data to said shifter.

16. The method of claim 15, wherein said processing step comprises selectively complementing said plurality of values output from said shifter.

17. The method of claim 11, further including the step of selectively applying one of said data work x and one of said values output from said shifter to an input of said shifter.

18. The method of claim 11, further including the steps of:
   latching said plurality of values output from said shifter;
   selectively applying one of said data work x and one of said values output from said shifter to an input of said shifter; and
   providing controller means for controlling said loading, said shifting, and said summing steps.

19. A method of generating indicia of the product of a data word x and a coefficient b, wherein said coefficient b is expressible as a sum of L terms of the form $b = f_1 2^{-p(1)}$; is in $+ f_2 2^{-p(2)} \ldots f_L 2^{-p(L)}$, wherein $f_L = +1, -1$, or 0 $p(i)$ is an integer for $i = 1$ to L, said method comprising the steps of:
   loading said data word x into a shifter;
   thereafter for each of said $(L-1)$ of said terms, shifting the contents of said shifter in accordance with a respective one of said terms, outputting a shifted value from said shifter, and loading said shifted value into said shifter; and
   summing said shifted values to form said indicia of said product.

20. The method of claim 19, wherein said step of loading said shifted value into said shifter comprises processing said shifted value.

* * * * *